US010804891B2

(12) United States Patent
Inada et al.

(10) Patent No.: US 10,804,891 B2
(45) Date of Patent: Oct. 13, 2020

(54) DRIVING DEVICE

(71) Applicant: Hitachi Automotive Systems, Ltd., Hitachinaka-shi, Ibaraki (JP)

(72) Inventors: Ryoichi Inada, Tokyo (JP); Teppei Hirotsu, Tokyo (JP); Hideyuki Sakamoto, Hitachinaka (JP); Kouichi Yahata, Hitachinaka (JP); Keiji Kadota, Hitachinaka (JP)

(73) Assignee: Hitachi Automotive Systems, Ltd., Hitachinaka-shi (JP)

(*) Notice: Subject to any disclaimer, the term of this patent is extended or adjusted under 35 U.S.C. 154(b) by 318 days.

(21) Appl. No.: 15/743,121

(22) PCT Filed: Jul. 6, 2016

(86) PCT No.: PCT/JP2016/069958
§ 371 (c)(1),
(2) Date: Jan. 9, 2018

(87) PCT Pub. No.: WO2017/006949
PCT Pub. Date: Jan. 12, 2017

(65) Prior Publication Data
US 2019/0103863 A1    Apr. 4, 2019

(30) Foreign Application Priority Data

Jul. 9, 2015  (JP) ................................. 2015-137387

(51) Int. Cl.
*H03K 17/082*   (2006.01)
*H02M 1/32*   (2007.01)
(Continued)

(52) U.S. Cl.
CPC ..... *H03K 17/0822* (2013.01); *G01R 31/3277* (2013.01); *G01R 35/00* (2013.01);
(Continued)

(58) Field of Classification Search
CPC ............ G01R 31/3277; G01R 31/2829; G01R 31/50; H02M 1/08; H02M 1/32;
(Continued)

(56) References Cited

U.S. PATENT DOCUMENTS 5,672,917 A * 9/1997 Nakano .............. G01R 31/3277
307/116
5,677,611 A * 10/1997 Yoshihara ............. B60L 3/0023
318/803
(Continued)

FOREIGN PATENT DOCUMENTS

JP    4-104067 A    4/1992
JP    8-29470 A     2/1996
(Continued)

OTHER PUBLICATIONS

International Search Report (PCT/ISA/210) issued in PCT Application No. PCT/JP2016/069958 dated Sep. 20, 2016 with English-language translation (Five (5) pages).
(Continued)

*Primary Examiner* — Jared Fureman
*Assistant Examiner* — Christopher J Clark
(74) *Attorney, Agent, or Firm* — Crowell & Moring LLP

(57) ABSTRACT

An object of the present invention is to diagnose an abnormality detecting circuit that detects an abnormality, such as an overcurrent of a power semiconductor, with the number of insulating elements to be additionally provided, inhibited from increasing. There are provided: a drive circuit configured to output a gate signal to a power semiconductor; an abnormality detecting circuit configured to detect an abnormality of the power semiconductor; and a diagnosis signal applying circuit configured to apply a diagnosis signal to the abnormality detecting circuit. The diagnosis signal applying circuit applies the diagnosis signal, on the basis of the gate signal output by the drive circuit.

11 Claims, 14 Drawing Sheets

(51) Int. Cl.
*G01R 31/327* (2006.01)
*G01R 35/00* (2006.01)
*H03K 17/08* (2006.01)
*H02M 1/08* (2006.01)
*H02M 1/084* (2006.01)
*G01R 31/42* (2006.01)
*H02H 7/122* (2006.01)

(52) U.S. Cl.
CPC ............... *H02M 1/08* (2013.01); *H02M 1/32* (2013.01); *H03K 17/0828* (2013.01); *G01R 31/42* (2013.01); *H02H 7/122* (2013.01); *H02M 1/084* (2013.01); *H02M 2001/322* (2013.01); *H02M 2001/327* (2013.01); *H03K 2017/0806* (2013.01); *H03K 2217/0081* (2013.01)

(58) Field of Classification Search
CPC ........... H02M 1/084; H02H 7/10; H02H 7/12; H02H 7/122; H02H 7/1225; H03K 17/08–0828
See application file for complete search history.

(56) References Cited

U.S. PATENT DOCUMENTS

2011/0278918 A1\* 11/2011 Shindo .................. B60L 3/0007
307/9.1
2012/0074885 A1\* 3/2012 Hirono .................... H02M 1/32
318/400.22

FOREIGN PATENT DOCUMENTS

| JP | 2007-104488 A | 4/2007 |
| JP | 2010-279125 A | 12/2010 |
| JP | 2015-2659 A | 1/2015 |

OTHER PUBLICATIONS

Japanese-language Written Opinion (PCT/ISA/237) issued in PCT Application No. PCT/JP2016/069958 dated Sep. 20, 2016 (Six (6) pages).

\* cited by examiner

DRIVING DEVICE

TECHNICAL FIELD

The present invention relates to a driving device.

BACKGROUND ART

A hybrid vehicle or an electric vehicle is equipped with a driving device, such as an inverter device, in order to drive a motor. The inverter device performs switching to a power semiconductor and converts a direct current supplied from a battery into an alternating current, so as to drive the motor. Driving devices including the inverter device, each are equipped with an abnormality detecting circuit that detects, when an abnormality occurs in an internal circuit, the abnormality. Examples of the abnormality detecting circuit include an overcurrent detecting circuit that detects a large current flowing through a power semiconductor, and an overheating detecting circuit that detects a power semiconductor abnormally heating.

However, in a case where the abnormality detecting circuits have been broken down, occurrence of an abnormality in the driving device cannot be detected, and thus there is a risk that a load, such as a motor, cannot be normally controlled. Therefore, fault diagnosis is required to be performed to the abnormality detecting circuits.

PTL 1 discloses a technology having an object to provide a motor control device enabled to diagnose an abnormality in overcurrent detecting means, the motor control device being capable of previously avoiding various problems to be caused by the abnormality. PTL 1 describes "the motor control device includes an overcurrent examination unit 19 configured to send, when a synchronous motor 11 does not rotate, a first examination voltage Vt1 lower than an overcurrent determination reference voltage Vref and a second examination voltage Vt2 not less than the reference voltage Vref, to an overcurrent detecting unit 18. An abnormality occurring in the overcurrent detecting unit 18 is determined when the first examination voltage Vt1 from the overcurrent examination unit 19 is determined that an overcurrent is present, from a compared result of the overcurrent detecting unit 18 or when the second examination voltage Vt2 from the overcurrent examination unit 19 is determined that no overcurrent is present, from the compared result of the overcurrent detecting unit 18".

CITATION LIST

Patent Literature

PTL 1: JP 2010-279125 A

SUMMARY OF INVENTION

Technical Problem

In PTL 1, the overcurrent examination unit that sends the examination voltages to the overcurrent detecting unit, applies the examination voltages to the overcurrent detecting unit, on the basis of a control signal from a control circuit. However, the control circuit and the overcurrent examination unit may be required to be electrically insulated, and thus, in transmitting a signal from the control circuit to the overcurrent detecting unit, for example, the signal is required to be transmitted through an insulating element, such as a photocoupler or a transformer. Such an insulating element is more expensive in unit cost than typical electric circuit components, such as a resistor, a capacitor, and a transistor, and thus there is a problem that the overcurrent examination unit highly costs.

An object of the present invention is to diagnose an abnormality detecting circuit that detects an abnormality, such as an overcurrent of a power semiconductor, with the number of insulating elements to be additionally provided, inhibited from increasing.

Solution to Problem

In order to solve the problem, a driving device according to the present invention includes: for example, a drive circuit configured to output a gate signal to a power semiconductor; an abnormality detecting circuit configured to detect an abnormality of the power semiconductor; and a diagnosis signal applying circuit configured to apply a diagnosis signal to the abnormality detecting circuit. The diagnosis signal applying circuit applies the diagnosis signal, on the basis of the gate signal output by the drive circuit.

Advantageous Effects of Invention

According to the present invention, the diagnosis signal applying circuit applies the diagnosis signal on the basis of the gate signal so that the abnormality detecting circuit can be diagnosed without newly providing an insulating element for inputting a control signal to the diagnosis voltage applying circuit.

DESCRIPTION OF EMBODIMENTS

Driving devices according to embodiments of the present invention will be described below with reference to the drawings. Note that the same elements in the figures are denoted with the same reference signs, and thus the descriptions to be duplicated will be omitted. Note that, in the following descriptions, when the voltage value of a signal line is a threshold value or more, the signal thereof is described 1. When the voltage value of a signal line is less than a threshold value, the signal thereof is described 0. Note that, a threshold voltage in determining that a signal is 1 and a threshold voltage in determining that a signal is 0, are not necessarily required to be equivalent to each other.

First Embodiment

Figure 1:
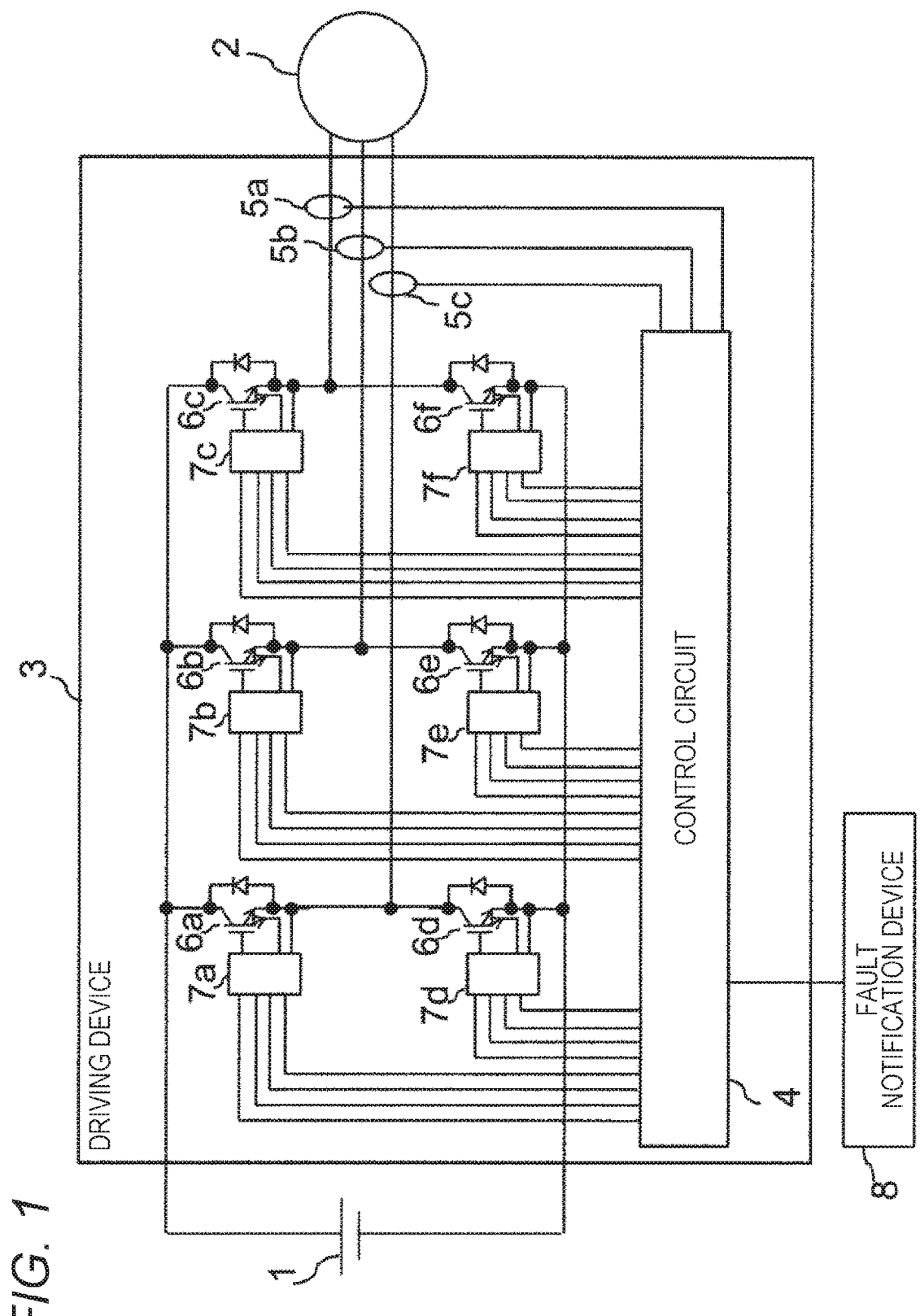
FIG. 1 is a diagram of the configuration of a driving device and a peripheral circuit according to a first embodiment.

FIG. 1 is a diagram of the configuration of a driving device 3 and the peripheral circuit thereof according to a first embodiment. The driving device 3 converts electric power input from an external power source 1 and performs output to a load 2 so as to drive the load 2. Examples of the external power source 1 include a battery. The load 2 is a load to be driven by the driving device 3, and examples of the load 2 include a motor, a solenoid, and a voltage transformer. According to the present embodiment, an example in which a three-phase alternating current motor is used as the load 2, is described.

The driving device 3 includes a control circuit 4, current sensors 5a to 5c, power semiconductors 6a to 6f, and driving circuits 7a to 7f. Note that, according to the present embodiment, since the three-phase motor is used as the load 2, the driving device 3 includes the six power semiconductors and the six driving circuits, but the number of power semiconductors and the number of driving circuits to be required vary depending on a type of load or a circuit configuration.

The control circuit 4 includes a CPU (not illustrated), a RAM (not illustrated), a ROM (not illustrated), and a communication circuit (not illustrated) inside. The ROM may be an electrically erasable programmable ROM (EE-PROM) or a flash ROM, each being electrically rewritable.

The control circuit 4 communicates with an electronic control device (not illustrated) outside the driving device 3, so as to receive a driving command for the load 2 from the different electronic control device. Then, driving control of the load 2 is performed on the basis of the driving command and respective current values acquired by the current sensors 5a, 5b, and 5c. In a case where determining a fault occurring inside the driving device 3, the control circuit 4 outputs a fault detected signal to a fault notification device 8.

The current sensors 5a, 5b, and 5c each are a sensor that measures a current flowing into the load 2. Three current sensors may be provided corresponding to three output lines in three phases, or not more than the three current sensors may be provided.

The power semiconductors 6a to 6f are semiconductor elements that perform switching operations on the basis of signals from the driving circuits 7a to 7f, respectively, and examples of the power semiconductors 6a to 6f include a power metal oxide semiconductor field effect transistor (MOSFET) and an insulated gate bipolar transistor (IGBT). The power semiconductors 6a to 6f each have a sense terminal. The sense terminal outputs a certain rate in a current flowing between the drain and source of the power semiconductor, for example, one thousandth of the current.

The driving circuits 7a to 7f receive driving signals 22 output from the control circuit 4, so as to switch the power semiconductors 6a to 6f ON or OFF, respectively. Abnormality detecting circuits that detect abnormalities of the power semiconductors 6a to 6f, are provided inside. The detailed configuration of each of the driving circuits will be described later with FIG. 2.

The fault notification device 8 receives the fault detected signal from the control circuit 4, so as to notify a person on board of the occurrence of the fault. Examples of a notification method for the fault include a method of turning on a lamp, a method of generating an alarm, and a method of issuing a notification with sound.

Figure 2:
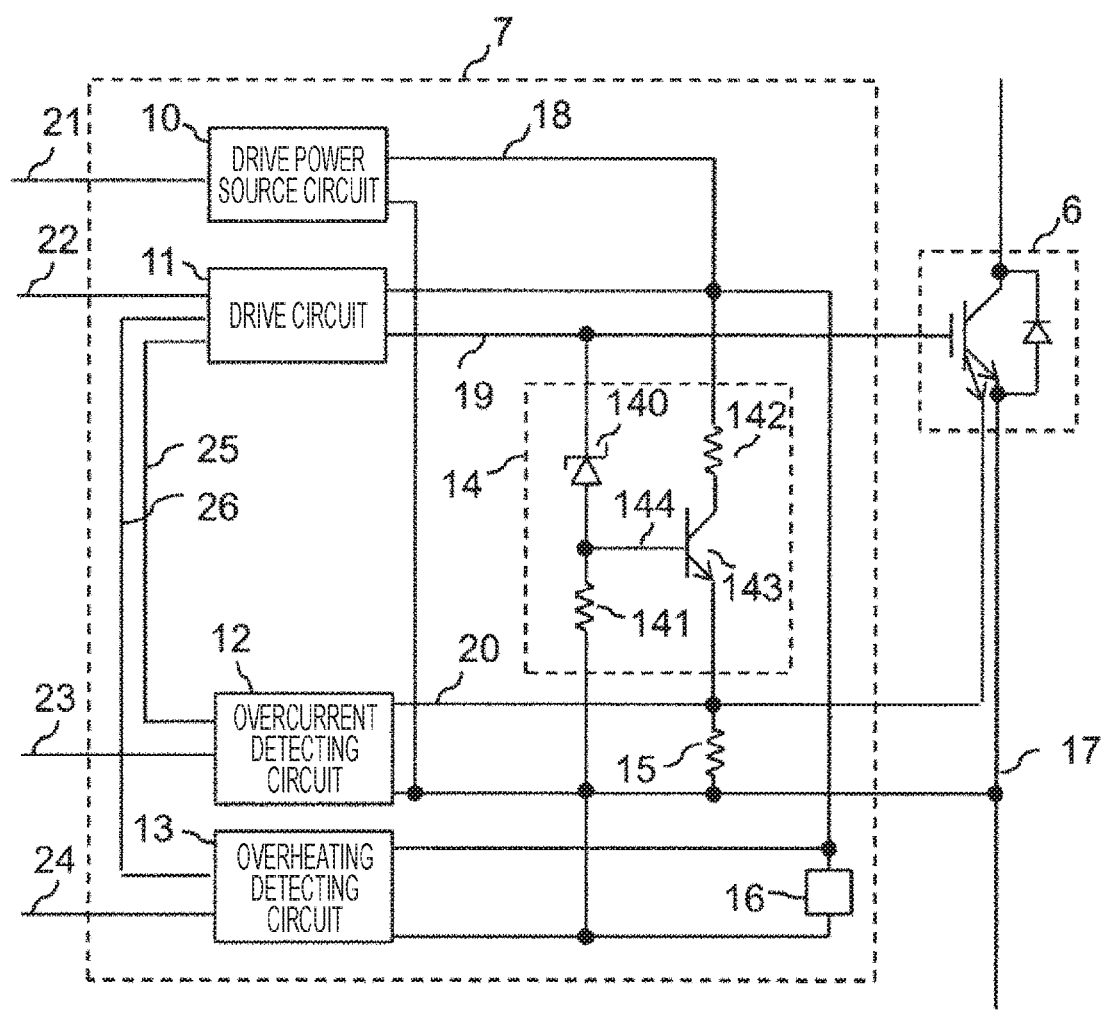
FIG. 2 is a diagram of the configuration of a power semiconductor and a driving circuit according to the first embodiment.

FIG. 2 is a diagram of the configuration of a power semiconductor 6 and a driving circuit 7 according to the present embodiment. Note that, the driving device 3 includes the six power semiconductors and the six driving circuit, but a circuit configuration per unit is the same as those of the others. Thus, FIG. 2 illustrates only a combination of a power semiconductor 6 being any one of the power semiconductors 6a to 6f and the driving circuit 7 corresponding to the power semiconductor 6.

The driving circuit 7 according to the present embodiment, includes a drive power source circuit 10, a drive circuit 11, an overcurrent detecting circuit 12, an overheating detecting circuit 13, a diagnosis signal applying circuit 14, a resistor 15, and a temperature sense element 16. The drive power source circuit 10, the drive circuit 11, the overcurrent detecting circuit 12, and the overheating detecting circuit 13 are electrically insulated inside.

Note that, according to the present embodiment, the drive power source circuit 10 is provided inside the driving circuit 7, but may be provided outside the driving circuit 7. A plurality of driving circuits 7 may share the drive power source circuit 10. According to the present embodiment, the drive circuit 11, the overcurrent detecting circuit 12, and the overheating detecting circuit 13 are isolated circuits, but the circuits may be united as one circuit. The drive circuit 11, the overcurrent detecting circuit 12, the overheating detecting circuit 13, and the diagnosis signal applying circuit 14 may be united as one circuit.

The drive power source circuit 10 is a circuit that supplies a drive power source voltage 18 to the drive circuit 11, the diagnosis signal applying circuit 14, and the temperature sense element 16. The drive power source circuit 10 has a function of switching the voltage value of the drive power source voltage 18 between two types of a normal value and a high voltage value, with a voltage switching signal 21 output from the control circuit 4. The internal configuration of the drive power source circuit 10 will be described later with FIG. 3.

The drive circuit 11 is a circuit that receives the driving signal 22 output from the control circuit 4 and outputs a gate signal 19 for switching the power semiconductor 6. In a case where the overcurrent detecting circuit 12 outputs a gate interrupting signal 25 or the overheating detecting circuit 13 outputs a gate interrupting signal 26, interrupting of the gate signal 19 is also performed.

According to the present embodiment, when the driving signal 22 is 1, the drive circuit 11 raises the voltage value of the gate signal 19 up to the drive power source voltage 18. When the driving signal 22 is 0, the drive circuit 11 reduces the voltage value of the gate signal 19 up to a source voltage 17. The interrupting of the gate signal indicates that the voltage value of the gate signal 19 is reduced up to the source voltage 17.

In a case where a certain level of current or more flows into the power semiconductor 6, the overcurrent detecting circuit 12 determines an overcurrent so as to output an overcurrent detected signal 23 to the control circuit 4. In the overcurrent detection, the gate interrupting signal 25 is output to the drive circuit 11 in order to bring the power semiconductor 6 into an OFF state. Note that, once detecting the overcurrent, the overcurrent detecting circuit 12 retains the output of the overcurrent detected signal 23 and the output of the gate interrupting signal 25 for a certain time.

The overcurrent detection is performed in a case where an overcurrent detecting terminal voltage 20 is a certain level larger than the source voltage 17. This is because a part of the current flowing through the power semiconductor 6 flows from the sense terminal into the resistor 15 and the potential difference between the overcurrent detecting terminal voltage 20 and the source voltage 17 increases as the value of the current flowing through the power semiconductor 6 increases.

Note that, according to the present embodiment, the resistor 15 converts the current output from the sense terminal of the power semiconductor 6, into a voltage, and the overcurrent detecting circuit 12 detects the overcurrent state on the basis of the voltage, but the overcurrent may be detected by using a different circuit configuration. For example, a shunt resistor may be provided on the source side of the power semiconductor 6, and the overcurrent detecting circuit 12 may determine an overcurrent state or a non-overcurrent state, on the basis of the potential difference between both ends of the shunt resistor. On the basis of the potential difference between the collector and source of the power semiconductor 6, the overcurrent detecting circuit 12 may determine an overcurrent state or a non-overcurrent state.

The overheating detecting circuit 13 outputs an overheating detected signal 24 to the control circuit 4 in a case where the power semiconductor 6 reaches a certain level or more in temperature. In the overheating detection, the gate interrupting signal 26 is output to the drive circuit 11 in order to bring the power semiconductor 6 into an OFF state. Note that, once detecting the overheated state, the overheating detecting circuit 13 retains the output of the overheating detected signal 24 and the output of the gate interrupting signal 26 for a certain time.

The overheating detection is performed in a case where the voltage between both ends of the temperature sense element 16 is measured and the potential difference between both of the ends is a certain value or less. Examples of the temperature sense element 16 include a diode and a thermistor. Note that the overheating detecting circuit 13 according to the present embodiment determines the overheating in the case where the potential difference between both of the ends of the temperature sense element 16 is the certain value or less, but may determine the overheating in a case where the potential difference between both of the ends of the temperature sense element 16 is a certain value or more.

The diagnosis signal applying circuit 14 includes a Zener diode 140, a resistor 141, a resistor 142, and a transistor 143 inside. The diagnosis signal applying circuit 14 is a circuit that applies a diagnosis signal to the overcurrent detecting circuit 12 when the voltage value of the gate signal 19 reaches a certain value or more. Specifically, in a case where the voltage value of the gate signal 19 is equivalent to the high voltage value of the drive power source voltage 18, a current flows through the Zener diode 140 and the resistor 141 so that a base voltage 144 rises. When the rise of the base voltage 144 brings the transistor 143 into an ON state, the overcurrent detecting terminal voltage 20 has a value in which the drive power source voltage 18 is divided in voltage by the resistor 142 and the resistor 15. With this arrangement, an overcurrent state is artificially generated so that the overcurrent detecting circuit 12 operates. Note that, according to the present embodiment, applying a voltage to the overcurrent detecting terminal voltage 20 by the diagnosis signal applying circuit 14, is described as application of the diagnosis signal.

In a case where the voltage value of the gate signal 19 is equivalent to the normal value of the drive power source voltage 18 or the source voltage 17, the current hardly flows through the Zener diode 140 so that the transistor 143 is brought into an OFF state. Therefore, the diagnosis signal applying circuit 14 applies no diagnosis signal.

Note that, in order for the diagnosis signal applying circuit 14 to perform the operation, the Zener diode 140 is required to be a Zener diode having a Zener voltage larger than the normal value of the drive power source voltage 18 and smaller than the high voltage value of the drive power source voltage 18.

Figure 3:
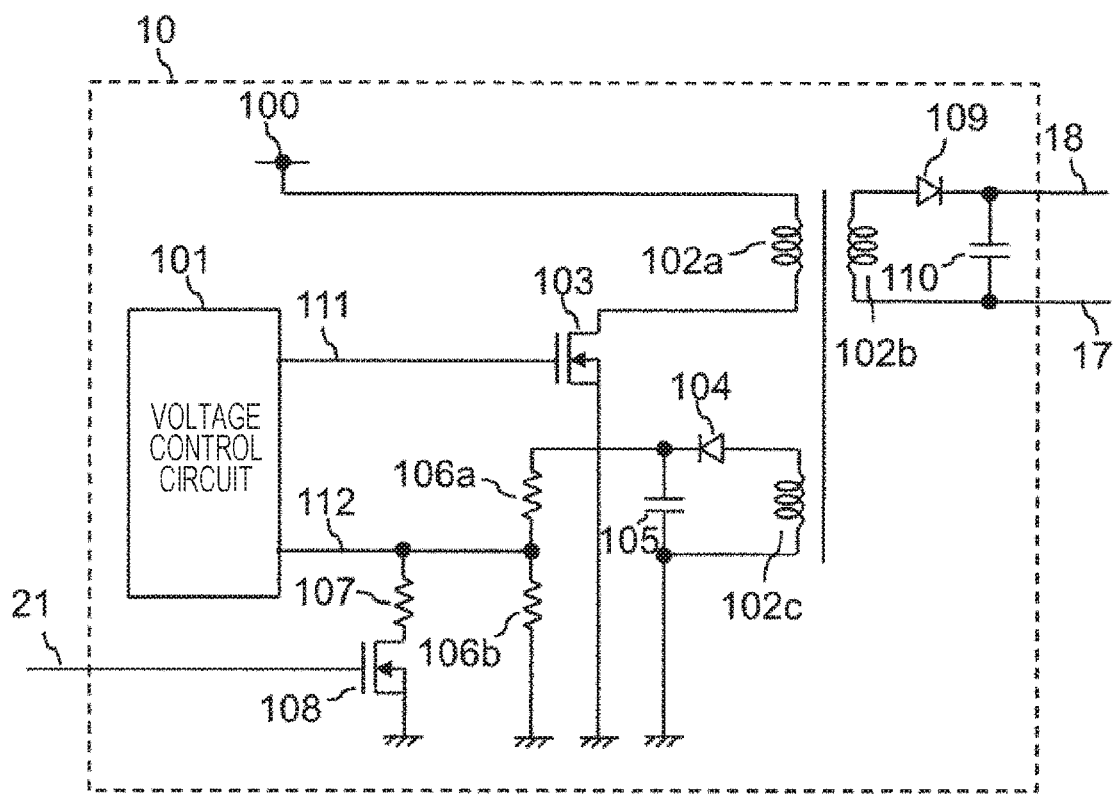
FIG. 3 is a diagram of the internal configuration of a drive power source circuit according to the first embodiment.

FIG. 3 is a diagram of the detailed internal configuration of the drive power source circuit 10.

The drive power source circuit 10 is a circuit that generates the drive power source voltage 18 from a direct current power source 100, and includes a voltage control circuit 101, transformers 102a to 102c, a switching transistor 103, rectifier diodes 104 and 109, smoothing capacitors 105 and 110, voltage-dividing resistors 106a and 106b, a variable-voltage resistor 107, and a variable-voltage transistor 108. Note that, the external power source 1 may directly supply a power source to the direct current power source 100, or a different power source circuit (not illustrated) may generate a power source including the external power source 1 raised or reduced in voltage so as to supply the power source to the direct current power source 100.

The voltage control circuit 101 is a circuit that controls the potential difference between the drive power source voltage 18 and the source voltage 17, to be a certain value, on the basis of a feedback voltage 112. In a case where the feedback voltage 112 reduces, the voltage control circuit 101 increases the duty cycle of a pulse width modulation (PWM) signal 111 in order for the feedback voltage to be a reference value, so that the drive power source voltage 18 and the feedback voltage 112 rise. In a case where the feedback voltage 112 rises, the voltage control circuit 101 decreases the duty cycle of the PWM signal 111 in order for the feedback voltage 112 to be the reference value, so that the drive power source voltage 18 and the feedback voltage 112 reduce.

The transformers 102a. 102b, and 102c each are a voltage transformer, the transformer 102a being a primary-side transformer, the transformer 102b being a secondary-side transformer for generating the drive power source voltage 18, the transformer 102c being a secondary-side transformer for generating the feedback voltage 112.

The switching transistor 103 is a transistor for controlling a current flowing through the transformer 102a, and is switched ON or OFF with the PWM signal 111 output from the voltage control circuit 101. The rectifier diode 104 is a diode for rectifying a current occurring in the transformer 102c. Similarly, the rectifier diode 109 is a diode for rectifying a current occurring in the transformer 102b.

The smoothing capacitor 105 is a capacitor for stabilizing a voltage occurring in the transformer 102c. Similarly, the smoothing capacitor 110 is a capacitor for stabilizing a voltage occurring in the transformer 102b.

The voltage-dividing resistors 106a and 106b are resistors for dividing the voltage occurring in the transformer 102c and generating the feedback voltage 112.

The variable-voltage resistor 107 and the variable-voltage transistor 108 are elements for varying the drive power source voltage 18. The variable-voltage transistor 108 is switched ON or OFF with the voltage switching signal 21 input from the control circuit 4. According to the present embodiment, when the voltage switching signal 21 is 1, the variable-voltage transistor 102 is defined to be brought into an ON state, and when the voltage switching signal 21 is 0, the variable-voltage transistor 102 is defined to be brought into an OFF state. The drive power source voltage 18 with the variable-voltage transistor 102 in the OFF state, is the normal value, and the drive power source voltage 18 with the variable-voltage transistor 102 in the ON state, is the high voltage value.

Figure 4:
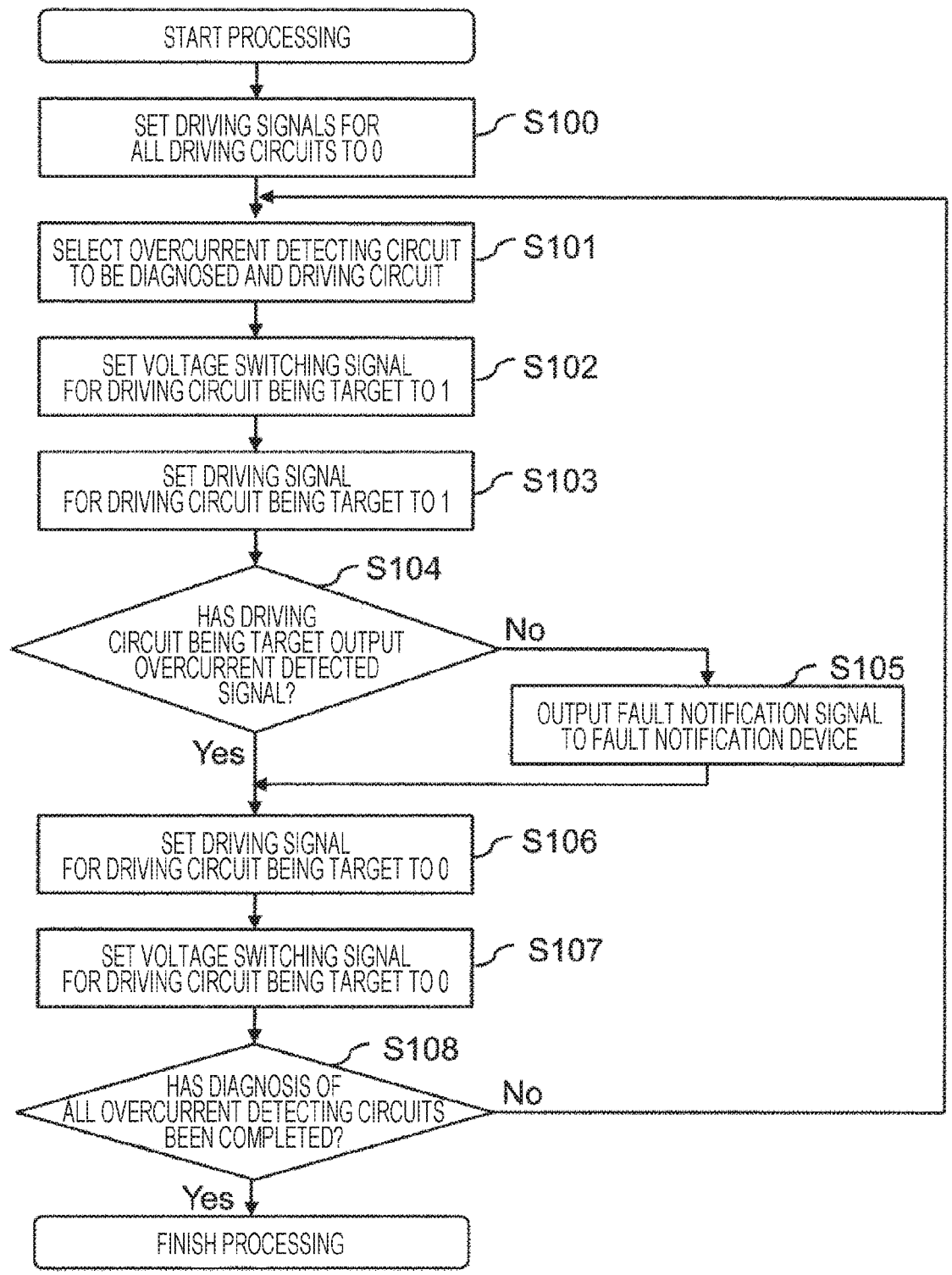
FIG. 4 is a flowchart of diagnosis processing of an overcurrent detecting circuit according to the first embodiment.

In a case where the variable-voltage transistor 108 is OFF, the feedback voltage 112 is generated in accordance with the voltage-dividing ratio between the voltage-dividing resistors 106a and 106b. When the variable-voltage transistor 108 is turned ON, the variable-voltage resistor 107 becomes in parallel to the voltage-dividing resistor 106b. Thus, the voltage-dividing ratio reduces and the feedback voltage 112 also reduces in comparison to the case where the variable-voltage transistor 108 is OFF. When the feedback voltage 112 reduces, the voltage control circuit 101 increases the duty cycle of the PWM signal 111 in order to retain the feedback voltage 112 constant. Therefore, in the case where the variable-voltage transistor 108 is ON, the drive power source voltage 18 rises in comparison to the case where the variable-voltage transistor 108 is OFF FIG. 4 is a flowchart of diagnosis processing of the overcurrent detecting circuit according to the present embodiment. When the load 2 is not driven, namely, no current flows to the load 2, the control circuit 4 performs the diagnosis processing at an arbitrary timing. For example, the diagnosis processing may be performed during the period from starting of the driving device 3 until the load 2 is driven, or may be performed every time a certain time passes in a case where the load 2 is not driven.

At step S100, the control circuit 4 sets the driving signals 22 for all the driving circuits 7, to 0. During diagnosis of an overcurrent detecting circuit 12, the power semiconductor 6 connected with the overcurrent detecting circuit 12 is turned ON. If a power semiconductor 6 not connected with the overcurrent detecting circuit 12 to be diagnosed, is also ON, a current may flow into the load 2 during the diagnosis so that the load 2 may be driven. Both power semiconductors 6 in upper-and-lower symmetry may be turned ON so that a large current may flow. The upper-and-lower symmetry indicates a combination of the power semiconductor 6a and the power semiconductor 6d, a combination of the power semiconductor 6b and the power semiconductor 6e, or a combination of the power semiconductor 6c and the power semiconductor 6f. In order to prevent such problems from occurring, diagnosis is performed after all the driving signals 22 are set to 0 and all the power semiconductors 6 are turned OFF At step S101, the control circuit 4 selects an overcurrent detecting circuit 12 to be diagnosed and the driving circuit 7 including the overcurrent detecting circuit 12 to be diagnosed. At step S102, the control circuit 4 changes the voltage switching signal 21 for the driving circuit 7 selected at step S101, from 0 to 1. With this arrangement, the drive power source voltage 18 inside the driving circuit 7 being the target becomes the high voltage value.

At step S103, the control circuit 4 changes the driving signal 22 for the driving circuit 7 being the target, from 0 to 1. With this arrangement, the drive circuit 11 inside the driving circuit 7 being the target, raises the gate signal 19 up to the drive power source voltage 18. Since the voltage of the gate signal 19 is now the high voltage value of the drive power source voltage 18, the diagnosis signal applying circuit 14 raises the overcurrent detecting terminal voltage 20. With this arrangement, the overcurrent detecting circuit 12 operates.

At step S104, the control circuit 4 determines whether the driving circuit 7 being the target has output the overcurrent detected signal 23. In a case where the overcurrent detected signal 23 has been output, the control circuit 4 determines that the overcurrent detecting circuit 12 to be diagnosed has normally operated, and proceeds to the processing at step S106. In a case where no overcurrent detected signal 23 has been output, the control circuit 4 determines that the overcurrent detecting circuit 12 to be diagnosed has been broken down, and proceeds to the processing at step S105.

At step S105, the control circuit 4 outputs the fault detected signal to the fault notification device 8. The fault notification device 8 operates with the reception, so as to notify the person on board, of the fault.

At step S106, the control circuit 4 changes the driving signal 22 for the driving circuit 7 being the target, from 1 to 0. With this arrangement, the drive circuit 11 inside the driving circuit 7 being the target, reduces the gate signal 19 up to the source voltage 17.

At step S107, the control circuit 4 changes the voltage switching signal 21 for the driving circuit 7 being the target, from 1 to 0. With this arrangement, the drive power source voltage 18 inside the driving circuit 7 being the target becomes the normal value.

At step S108, the control circuit 4 determines whether diagnosis of all the overcurrent detecting circuits 12 has been completed. In a case where an overcurrent detecting circuit 12 that has not been diagnosed, is present, the processing goes back to step S101 and then diagnosis is performed to the overcurrent detecting circuit 12 that has not been diagnosed yet. In a case where the diagnosis of all the overcurrent detecting circuits 12 has been completed, the control circuit 4 finishes the diagnosis processing.

As described above, according to the present embodiment, in diagnosing each of the overcurrent detecting circuits 12, the control circuit 4 raises the voltage of the gate signal 19 with the voltage switching signal 21 and the driving signal 22, so as to operate the diagnosis voltage applying circuit 14. On the basis of the voltage value of the gate signal 19, the diagnosis voltage applying circuit 14 determines whether to apply the diagnosis signal to the overcurrent detecting circuit 12. With this arrangement, the control circuit 4 is not required to transmit a signal for diagnosis, to the diagnosis signal applying circuit 14, and thus addition of an insulating element for the signal transmission, is not required. Therefore, the diagnosis of the overcurrent detecting circuits 12 can be achieved at low cost.

The variation of the drive power source voltage 18 in diagnosing each of the overcurrent detecting circuits 12 and in driving the load 2, prevents the drive of the load 2 from being inhibited by the application of the diagnosis signal by the diagnosis signal applying circuit 14 while the control circuit 4 is driving the load 2.

Second Embodiment

According to the present embodiment, an exemplary driving device capable of diagnosing that an abnormality detecting circuit can normally output an abnormality detected signal and additionally a gate signal can be normally interrupted, will be given. The configuration of the driving device and the peripheral circuit thereof according to the present embodiment, is the same as that according to the first embodiment, and thus the description will be omitted. Similarly, the configuration of a power semiconductor and a driving circuit and the internal configuration of a drive power source circuit according to the present embodiment, are the same as those according to the first embodiment, and thus the descriptions will be omitted.

Figure 5:
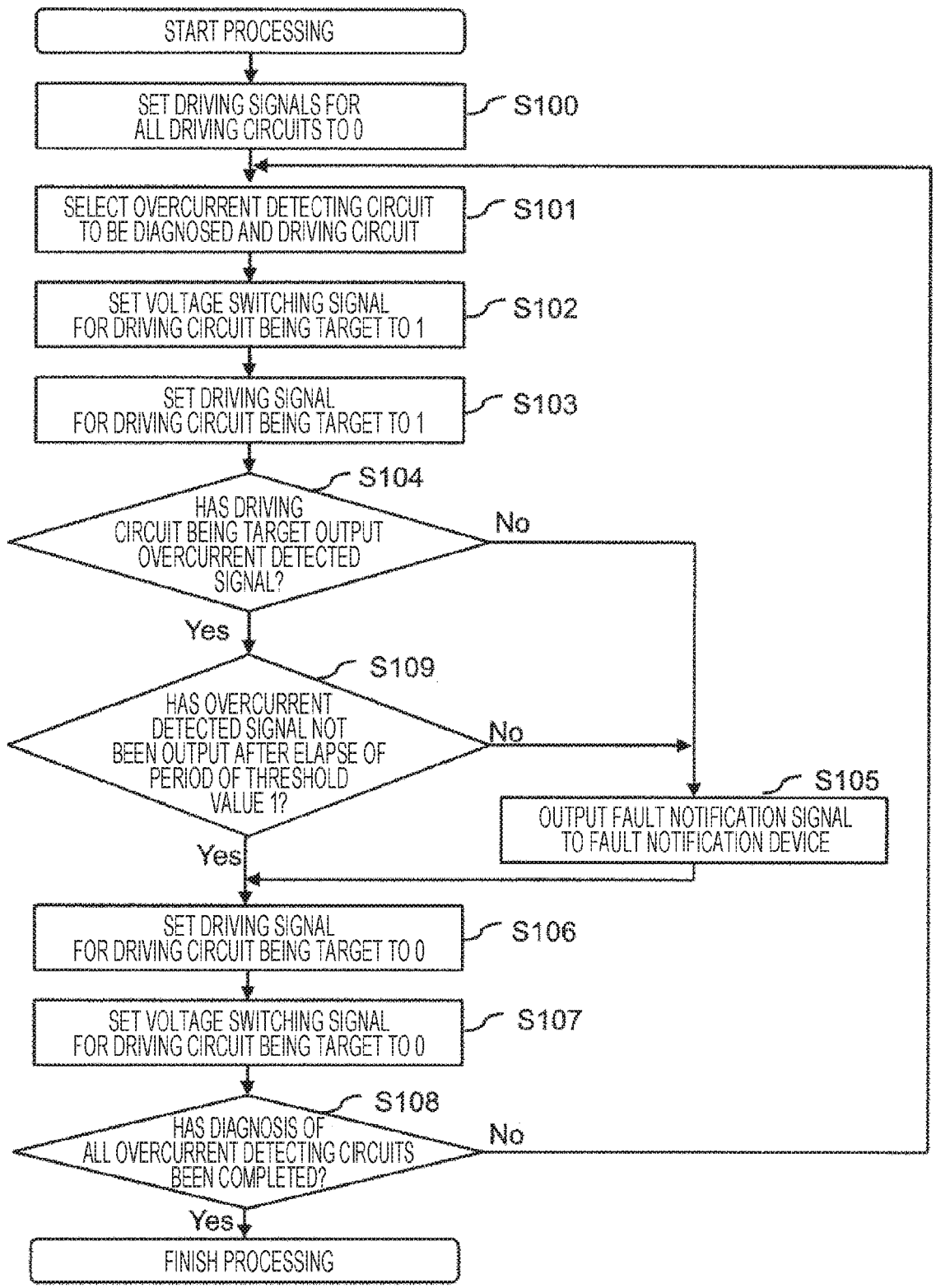
FIG. 5 is a flowchart of diagnosis processing of an overcurrent detecting circuit according to a second embodiment.

FIG. 5 is a flowchart of diagnosis processing of an overcurrent detecting circuit according to the present embodiment. The fault diagnosis processing is performed by a control circuit 4 at an arbitrary timing with the load 2 not driven, similarly to that according to the first embodiment.

The processing from step S100 to step S108 in FIG. 5 is similar to that according to the first embodiment, and thus the description will be omitted. In FIG. 5, the processing at step S109 is added subsequently to the processing at step S104.

At step S109, the control circuit 4 determines whether an overcurrent detected signal 23 has not been output after the elapse of a threshold value 1 after the overcurrent detected signal 23 starts to be output at step S104. In a case where the overcurrent detected signal 23 has not been output at the elapse of the threshold value 1, the control circuit 4 proceeds to the processing at step S106. In a case where the overcurrent detected signal 23 has continued to be output at the elapse of the threshold value 1, the control circuit 4 proceeds to the processing at step S105. Note that the time of the threshold value 1 is a time longer than the time during which the overcurrent detecting circuit 12 retains the output of the overcurrent detected signal 23.

If the overcurrent detected signal 12 and a drive circuit 11 normally operate when a diagnosis signal applying circuit 14 applies a diagnosis signal to the overcurrent detecting circuit 12, the gate signal 19 is interrupted and the voltage value of the gate signal 19 reduces up to a source voltage 17. After that, the diagnosis signal applying circuit 14 stops applying the diagnosis signal to the overcurrent detecting circuit 12 so that the overcurrent detecting circuit 12 does not detect the overcurrent state. Therefore, the overcurrent detecting circuit 12 stops outputting the overcurrent detected signal 23 after retaining the overcurrent detected signal 23 in an output state for a certain time.

If the overcurrent detected signal 12 or the drive circuit 11 breaks down and the gate signal 19 is not normally interrupted, the diagnosis signal applying circuit 14 continues to apply the diagnosis signal to the overcurrent detecting circuit 12. As a result, an artificial overcurrent state continues to be retained so that the overcurrent detecting circuit 12 is to continue to output the overcurrent detected signal 23 for an original output retaining time or more. Therefore, on the basis of whether the overcurrent detecting circuit 12 outputs the overcurrent detected signal 23 for the original output retaining time or more, it can be determined whether the gate signal 19 is normally interrupted.

Third Embodiment

According to the present embodiment, an exemplary driving device capable of diagnosing, at low cost, that an abnormality detecting circuit can normally output an abnormality detected signal, in a circuit configuration different from that according to the first embodiment, will be given.

Figure 6:
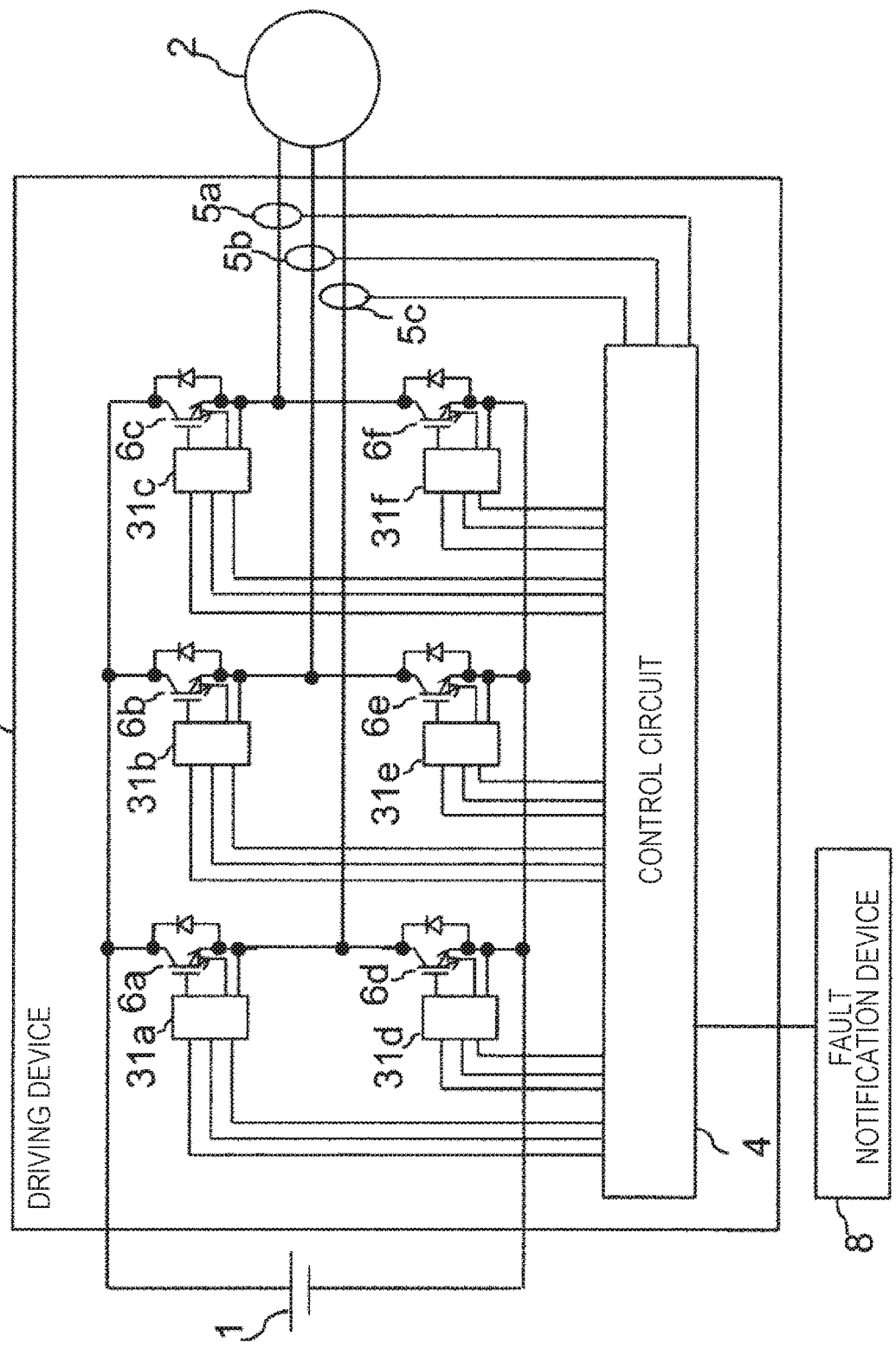
FIG. 6 is a diagram of the configuration of a driving device and a peripheral circuit according to a third embodiment.

FIG. 6 is a diagram of the configuration of the driving device and a peripheral circuit according to the present embodiment. The driving device 30 includes driving circuits 31a to 31f different from the driving circuits 7a to 7f included in the driving device 3 according to the first embodiment. No voltage switching signal 21 is connected between a control circuit 4 and each of the driving circuits 31a to 31f in the driving device 30. The configuration except that, is similar to that according to the first embodiment, and thus the description will be omitted.

Figure 7:
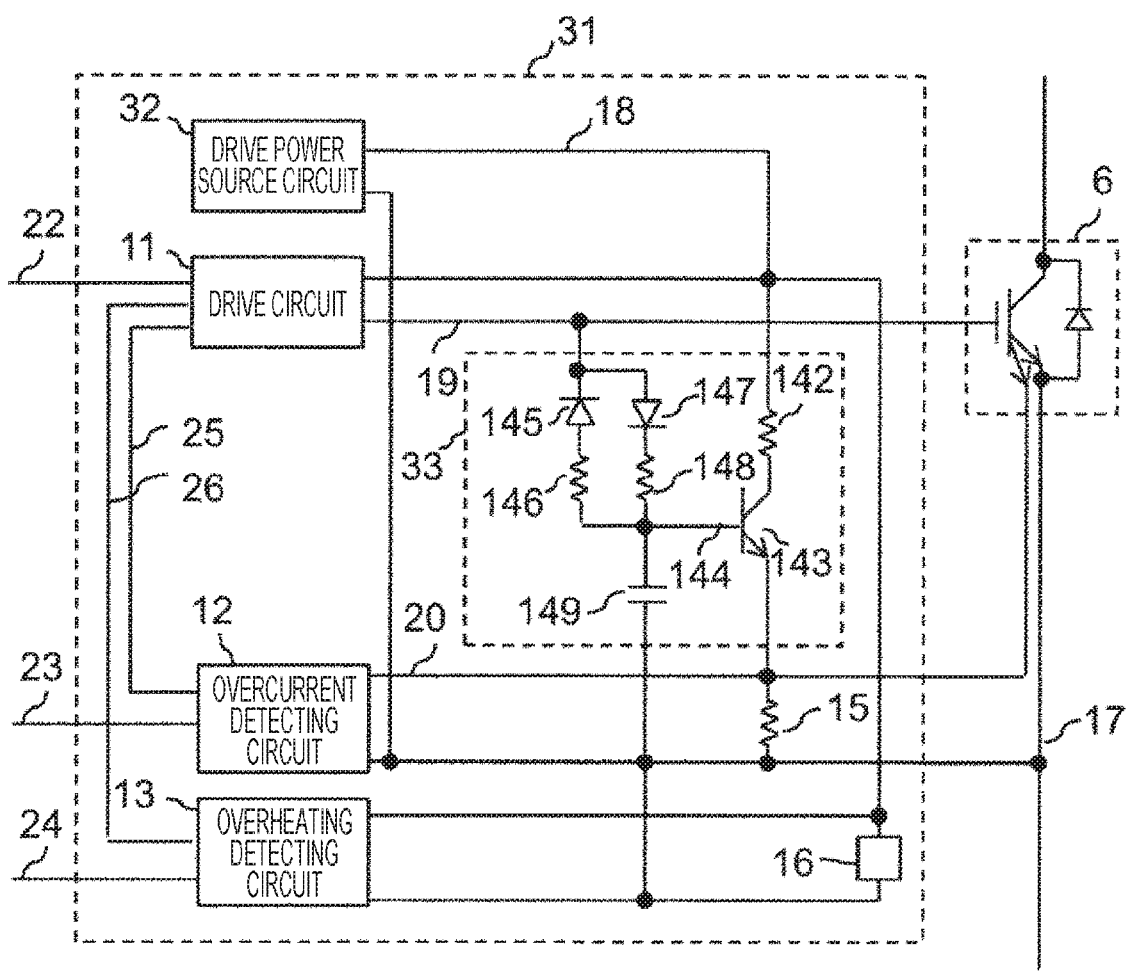
FIG. 7 is a diagram of the configuration of a power semiconductor and a driving circuit according to the third embodiment.

FIG. 7 is a diagram of the configuration of a power semiconductor 6 and a driving circuit 31 according to the present embodiment. The driving circuit 31 indicates any one of the driving circuits 31a to 31f in FIG. 6. The driving circuit 31 includes a drive power source circuit 32 different from the drive power source circuit 10 included in the driving circuit 7 according to the first embodiment. The driving circuit 31 includes a diagnosis signal applying circuit 33 different from the diagnosis signal applying circuit 14 included in the driving circuit 7 according to the first embodiment.

The diagnosis signal applying circuit 33 includes diodes 145 and 147, resistors 146 and 148, and a capacitor 149, instead of the Zener diode 140 and the resistor 141 in FIG. 2.

In a case where the voltage value of a gate signal 19 is equivalent to a drive power source voltage 18, the diagnosis signal applying circuit 33 charges the capacitor 149 through the diode 147 and the resistor 148, so as to raise a base voltage 144. In a case where the voltage value of the gate signal 19 is equivalent to a source voltage 17, the diagnosis signal applying circuit 33 operates to discharge the capacitor 149 through the diode 145 and the resistor 146 so that the base voltage 144 is reduced. When the base voltage 144 exceeds a certain voltage value (the ON threshold value of a transistor 143), the transistor 143 is turned ON and then a diagnosis signal is applied to an overcurrent detecting circuit 12, similarly to the first embodiment.

The charged speed of the capacitor 149 depends on the resistance value of the resistor 148, and thus the charged speed decelerates as the resistance value increases. The discharged speed of the capacitor 149 depends on the resistance value of the resistor 146, and thus the discharged speed decelerates as the resistance value increases. When the control circuit 4 is driving a load 2, the capacitor 149 also repeats charging and discharging in response to the voltage value of the gate signal 19. However, when the diagnosis signal applying circuit 33 operates to apply the diagnosis signal during the drive of the load 2, a control operation is inhibited. Therefore, in order for the diagnosis voltage applying circuit 33 not to operate to apply the diagnosis signal during the drive control of the load 2, the resistance value of the resistor 146 and the resistance value of the resistor 148 are required to be determined on the basis of the time during which the voltage value of the gate signal 19 is equivalent to the drive power source voltage 18 during the control and the time during which the voltage value of the gate signal 19 is equivalent to the source voltage 17 during the control.

Figure 8:
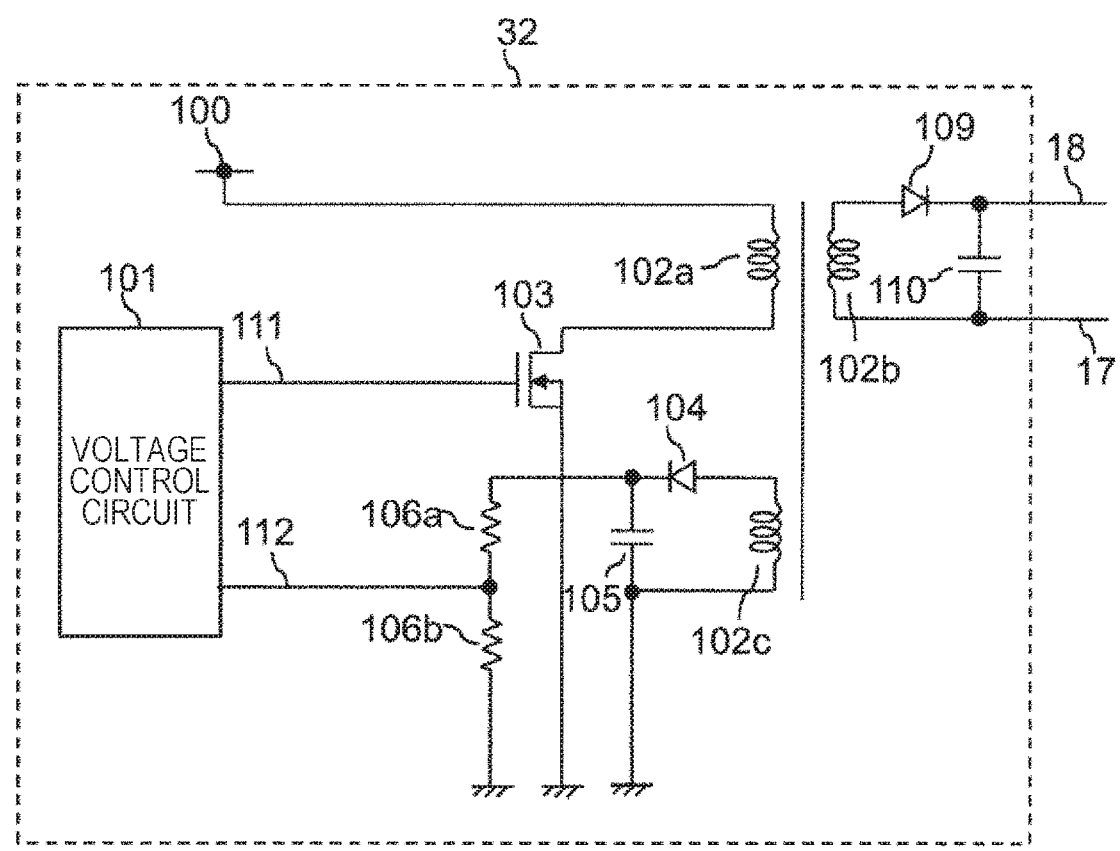
FIG. 8 is a diagram of the internal configuration of a drive power source circuit according to the third embodiment.

FIG. 8 is a diagram of the internal configuration of the drive power source circuit according to the present embodiment. The drive power source circuit 31 illustrated in FIG.

8 includes no variable-voltage resistor 101 and no variable-voltage transistor 102, differently from the drive power source circuit 10.

Figure 9:
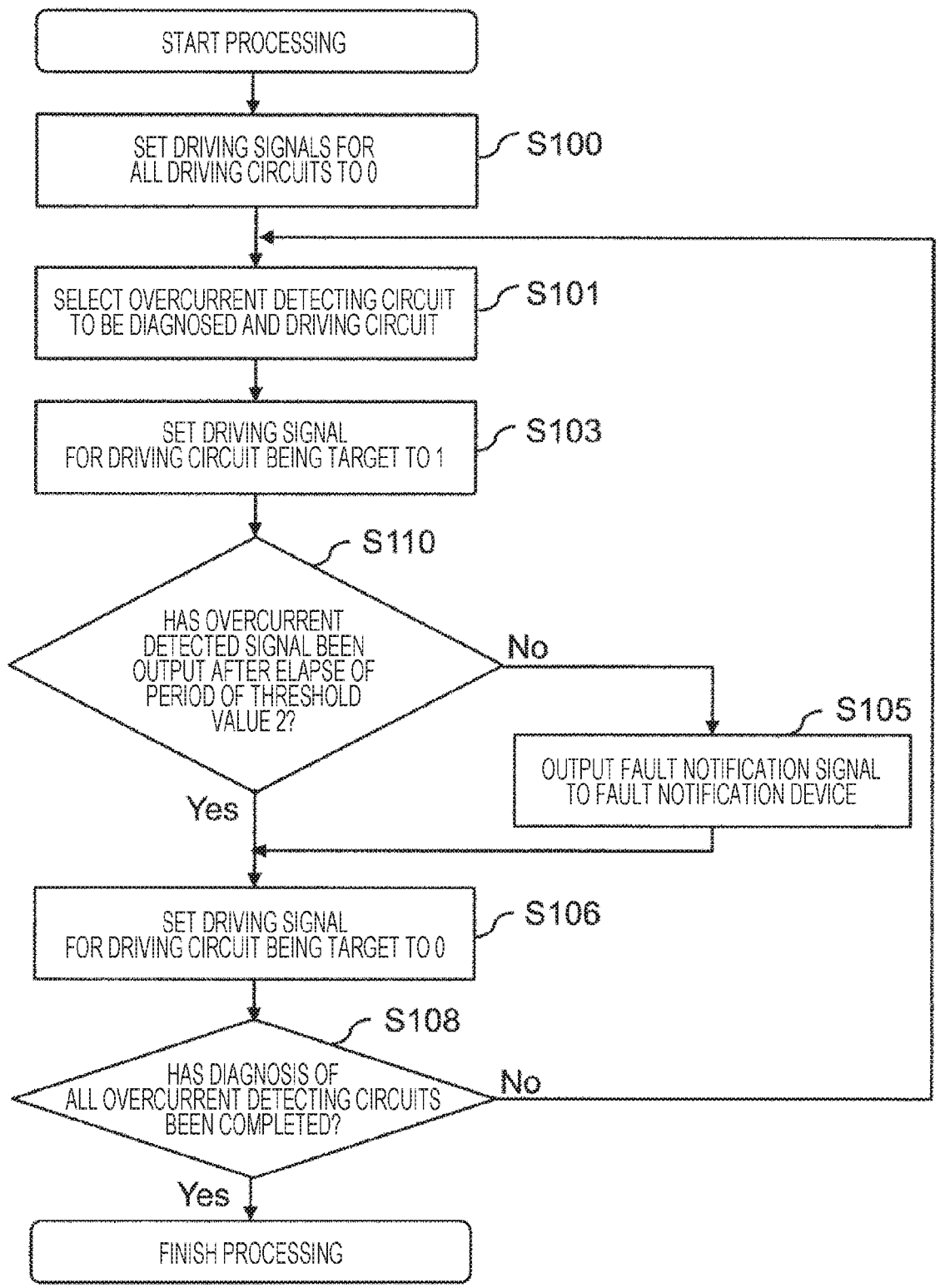
FIG. 9 is a flowchart of diagnosis processing of an overcurrent detecting circuit according to the third embodiment.

FIG. 9 is a flowchart of diagnosis processing of the overcurrent detecting circuit according to the present embodiment. In the processing of FIG. 9, the control circuit 4 performs the processing at step S110 after the processing at step S103. At step S110, the control circuit 4 checks whether the driving circuit 30 has output an overcurrent detected signal 23 at the elapse of a threshold value 2 after changing a driving signal 22 to 1 at step S103. In a case where the overcurrent detecting circuit 23 has been output, the control circuit 4 determines that the overcurrent detecting circuit 12 has normally operated, and then proceeds to the processing at step S106. In a case where no overcurrent detecting circuit 23 has been output, the control circuit 4 determines that the overcurrent detecting circuit 12 has been broken down, and then performs the processing at step S105.

Note that, the reason why the elapse of the threshold value 2 is required at step S109 is that the diagnosis signal applying circuit 33 does not apply the diagnosis signal if the capacitor 149 is not sufficiently charged. Therefore, the time of the threshold value 2 is required to be set longer than the time until the transistor 143 is brought into an ON state by the charging of the capacitor 149 after the driving signal 22 is turned 1.

According to the present embodiment, in diagnosing the overcurrent detecting circuit 12, the control circuit 4 keeps the driving signal 22 in 1 during the charged time of the capacitor 149 or more, so that the diagnosis voltage applying circuit 33 operates. The diagnosis voltage applying circuit 33 determines whether to apply the diagnosis signal to the overcurrent detecting circuit 12, on the basis of the charged state of the capacitor 149, namely, whether the voltage value of the gate signal 19 equivalent to the drive power source voltage 18, has been retained for a certain time or more. With this arrangement, the control circuit 4 is not required to transmit a signal for diagnosis, to the diagnosis signal applying circuit 33, and thus addition of an insulating element for the signal transmission, is not required. Therefore, the diagnosis of the overcurrent detecting circuits 12 can be achieved at low cost.

Note that, the diagnosis signal applying circuit 33 according to the present embodiment, is configured to apply the diagnosis signal when the capacitor 149 is charged up to a threshold value or more. Retaining the driving signal 22 in 1 for a certain time or more even in the diagnosis processing of each of the overcurrent detecting circuits 12, operates the diagnosis signal applying circuit 33. However, this is just exemplary, and thus the diagnosis signal applying circuit 33 can be configured to apply the diagnosis signal when the capacitor 149 is discharged up to a threshold value or less. In accordance with alteration of the configuration of the diagnosis signal applying circuit 33, the diagnosis processing of the overcurrent detecting circuit 12 can be altered.

Fourth Embodiment

According to the present embodiment, an exemplary driving device capable of diagnosing that an abnormality detecting circuit can normally output an abnormality detected signal and additionally a gate signal can be normally interrupted, in the configuration according to the third embodiment, will be given. The configuration of the driving device and the peripheral circuit thereof, is the same as that according to the third embodiment, and thus the description will be omitted. Similarly, the configuration of a power semiconductor and a driving circuit and the internal configuration of a drive power source circuit according to the present embodiment, are the same as those according to the third embodiment, and thus the descriptions will be omitted.

Figure 10:
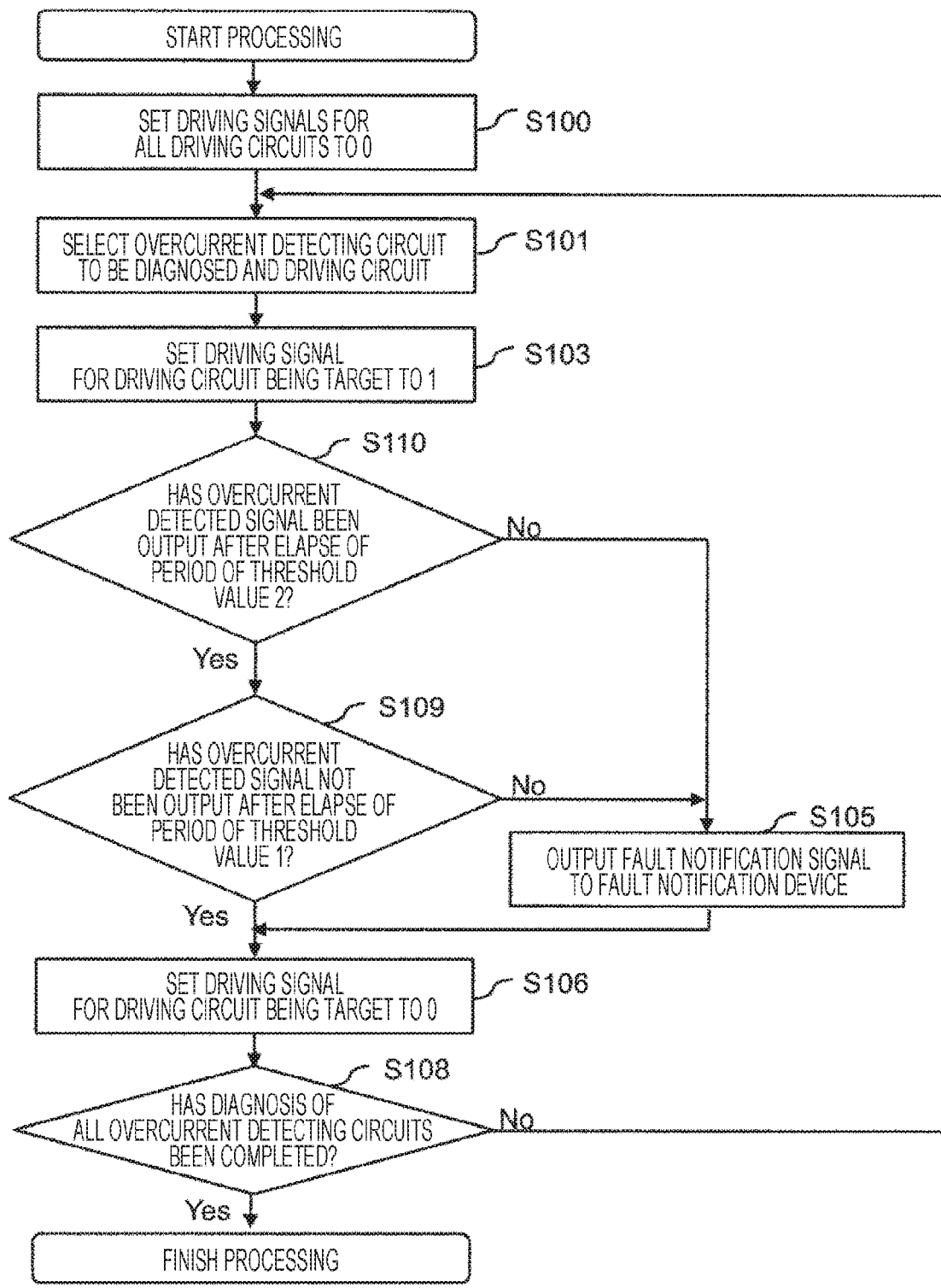
FIG. 10 is a flowchart of diagnosis processing of an overcurrent detecting circuit according to a fourth embodiment.

FIG. 10 is a flowchart of diagnosis processing of an overcurrent detecting circuit according to the present embodiment. Each piece of processing in the flowchart of FIG. 10 is similar to the processing illustrated in FIG. 9 except for the processing at step S109 of FIG. 6 added subsequently to the processing at step S110 in the flowchart of FIG. 9, and thus the description of individual processing information will be omitted.

According to the present embodiment, it can be diagnosed that a gate signal 19 is normally interrupted, even in the configuration according to the third embodiment, as described in the second embodiment.

For the configuration according to the second embodiment, the driving signal 22 is 1 during the diagnosis of each of the overcurrent detecting circuits 12, and thus the diagnosis signal applying circuit 12 again applies the diagnosis signal immediately when the interrupting of the gate signal 19 is released. Therefore, the stop of the output of the overcurrent detected signal 23 is difficult to detect at step S109, and thus the overcurrent detecting circuit 12 or the drive circuit 11 may be determined being broken down even when the gate signal 19 is normally interrupted.

A diagnosis signal applying circuit 33 according to the embodiment, does not apply a diagnosis signal until a capacitor 149 is charged up to the ON threshold value of a transistor 143 or more, and thus the output of an overcurrent detected signal 23 stops during the elapse of the charged time thereof after the interruption of the gate signal 19 is released. Therefore, in comparison to the case according to the second embodiment, the stop of the output of the overcurrent detected signal 23 is easy to detect at step S109 so that the erroneous fault determination described above can be prevented.

According to the third embodiment, the description in which the diagnosis signal applying circuit 33 can be configured to apply the diagnosis signal in the case where the capacitor 149 is discharged not more than the threshold value, has been given, but the application of the diagnosis signal must be stopped in a case where the gate signal 19 equivalent to the source voltage 17 continues for a certain time or more, in order to determine that the gate signal 19 is normally interrupted. Therefore, the diagnosis method cannot determine that the gate signal 19 is normally interrupted, in a case where the diagnosis signal applying circuit 33 is configured to apply the diagnosis signal in a case where the capacitor 149 is discharged not more than the threshold value.

Fifth Embodiment

According to the present embodiment, an exemplary driving device capable of diagnosing, at low cost, that an abnormality detecting circuit can normally output an abnormality detected signal, in a circuit configuration different from those according to the first and third embodiments, will be given.

Figure 11:
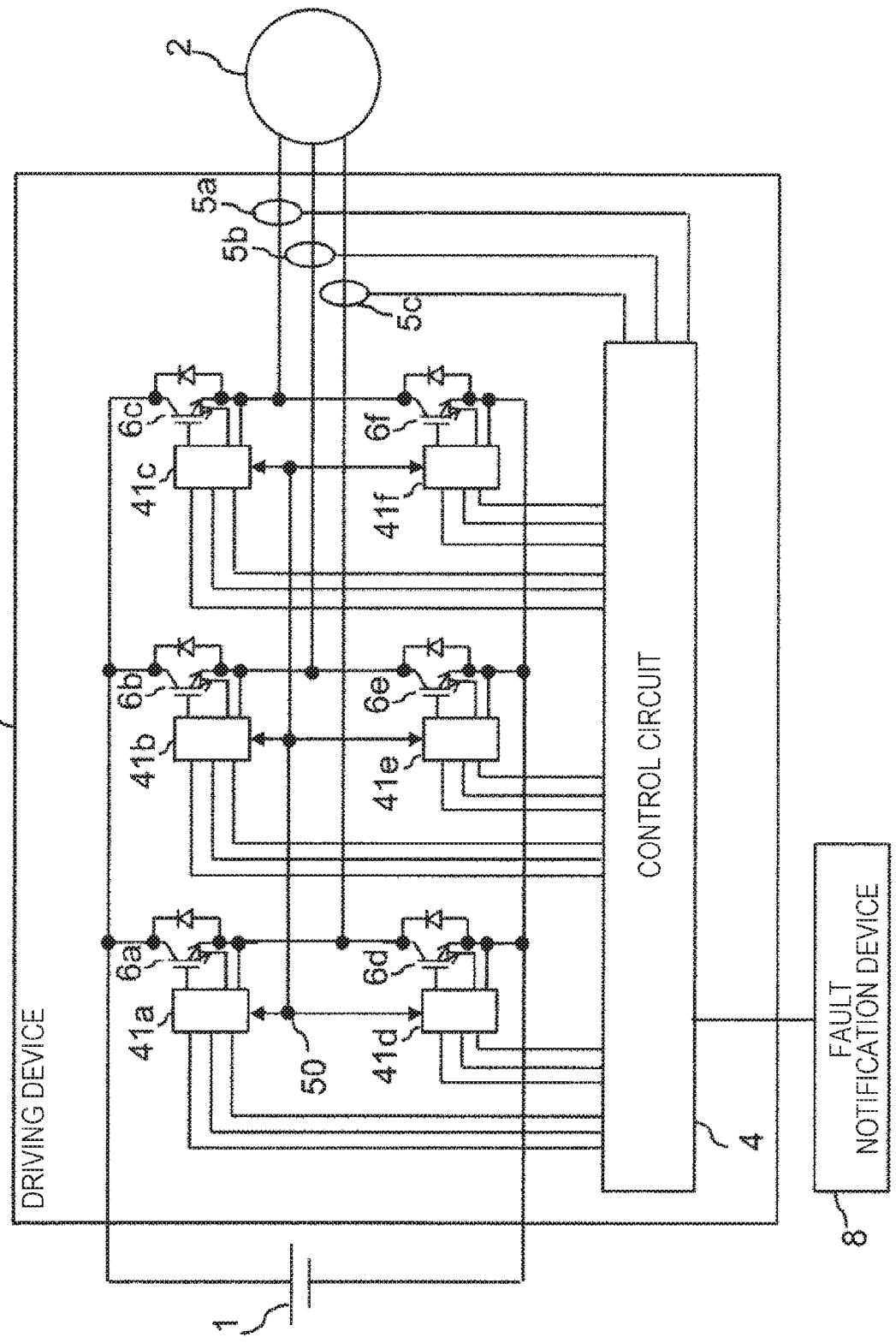
FIG. 11 is a diagram of the configuration of a driving device and a peripheral circuit according to a fifth embodiment.

FIG. 11 is a diagram of the configuration of the driving device and a peripheral circuit according to the present embodiment. The driving device 40 includes driving circuits 41a to 41f different from the driving circuits 31a to 31f included in the driving device 30 according to the third embodiment. The driving circuits 41a to 41f mutually connect gate signals connected to power semiconductors 6a to 6f, as wiring 50 between the driving circuits.

Figure 12:
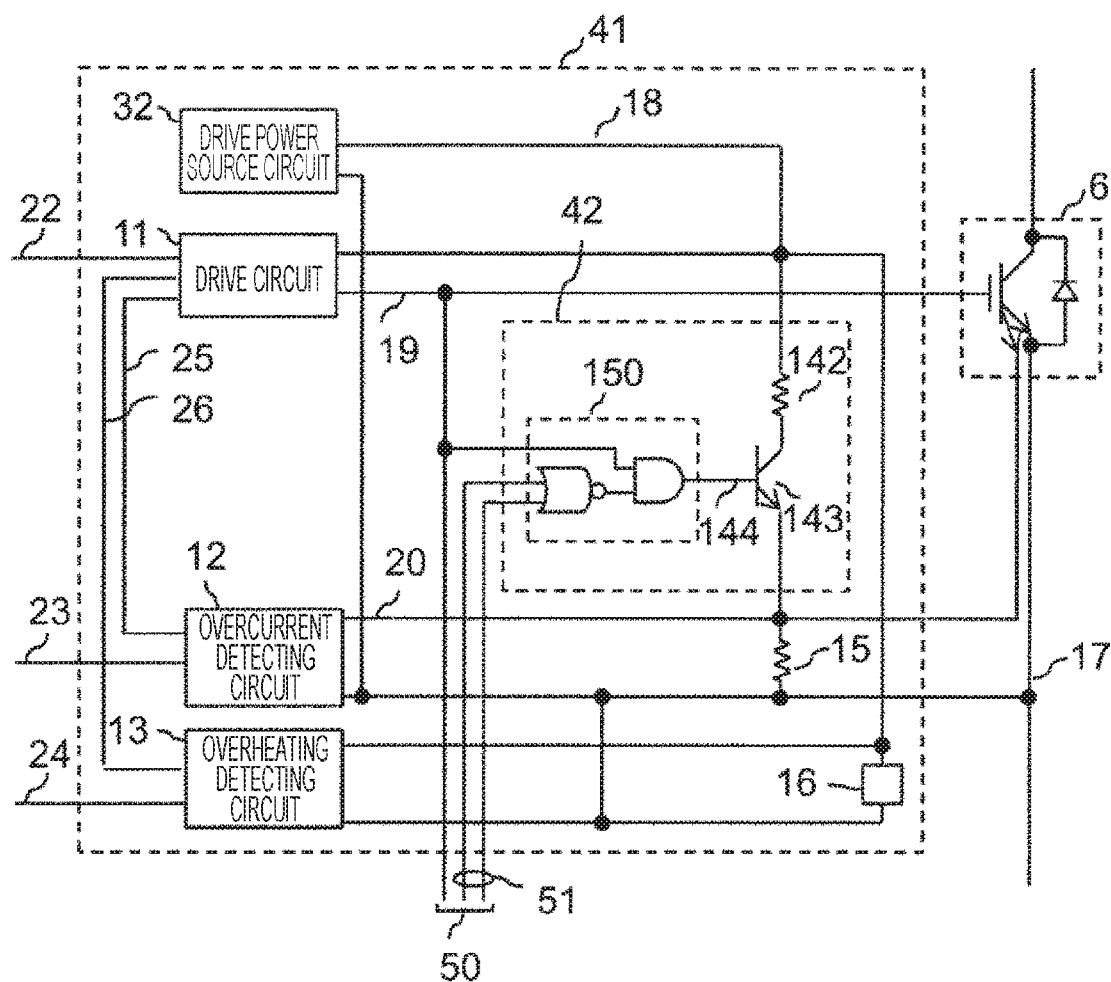
FIG. 12 is a diagram of the configuration of a power semiconductor and a driving circuit according to the fifth embodiment.

FIG. 12 is a diagram of the configuration of a power semiconductor and a driving circuit according to the present embodiment. The driving circuit 41 indicates any one of the driving circuits 41a to 41f in FIG. 11. The driving circuit 41 includes a diagnosis signal applying circuit 42 different from the diagnosis signal applying circuit 33 included in the driving circuit 31 according to the third embodiment. Gate signals 51 from the other driving circuits are input into the driving circuit 41, and a gate signal 19 is output to the other driving circuits.

The diagnosis signal applying circuit 42 includes a logic gate 150, instead of the Zener diode 140 and the resistor 141 in FIG. 2. The diagnosis signal applying circuit 42 brings a transistor 143 into an ON state in a specific combination of the gate signal 19 and the gate signals 51 of the other driving circuits, so as to apply a diagnosis signal to an overcurrent detecting circuit 12. According to the present embodiment, the logic gate 150 brings the transistor 143 into the ON state when the voltage value of the gate signal 19 is a threshold voltage or more and the voltage values of all the gate signals 51 are less than the threshold voltage. The threshold voltage is determined by the configuration of a source voltage 17 and the logic gate 150.

Note that, in order for the diagnosis signal applying circuit 44 not to apply the diagnosis signal while a control circuit 4 is operating a load 2, a combination never occurring in normal control, is desirably selected for the specific combination of the gate signal 19 and the gate signals 51. Normally, for the power semiconductors in upper-and-lower symmetry, when one power semiconductor is ON, the other power semiconductor is OFF. Therefore, a case where the gate signal 19 of the power semiconductor 6 connected with the overcurrent detecting circuit 12 to be diagnosed, brings the power semiconductor into an ON state and the gate signals 51 of the other power semiconductors bring the power semiconductors into OFF states, is considered as one example of the specific combination. Other than the case, a case where the gate signal 19 and the gate signals 51 bring all the power semiconductors into OFF states, is also considered for the specific combination.

Note that, according to the present embodiment, the logic gate 150 includes a NOR gate and an AND gate, but may include a different logic gate in accordance with the specific combination. The logic gate 150 may include, for example, a diode or a transistor, or may include one or a plurality of integrated circuits.

Figure 13:
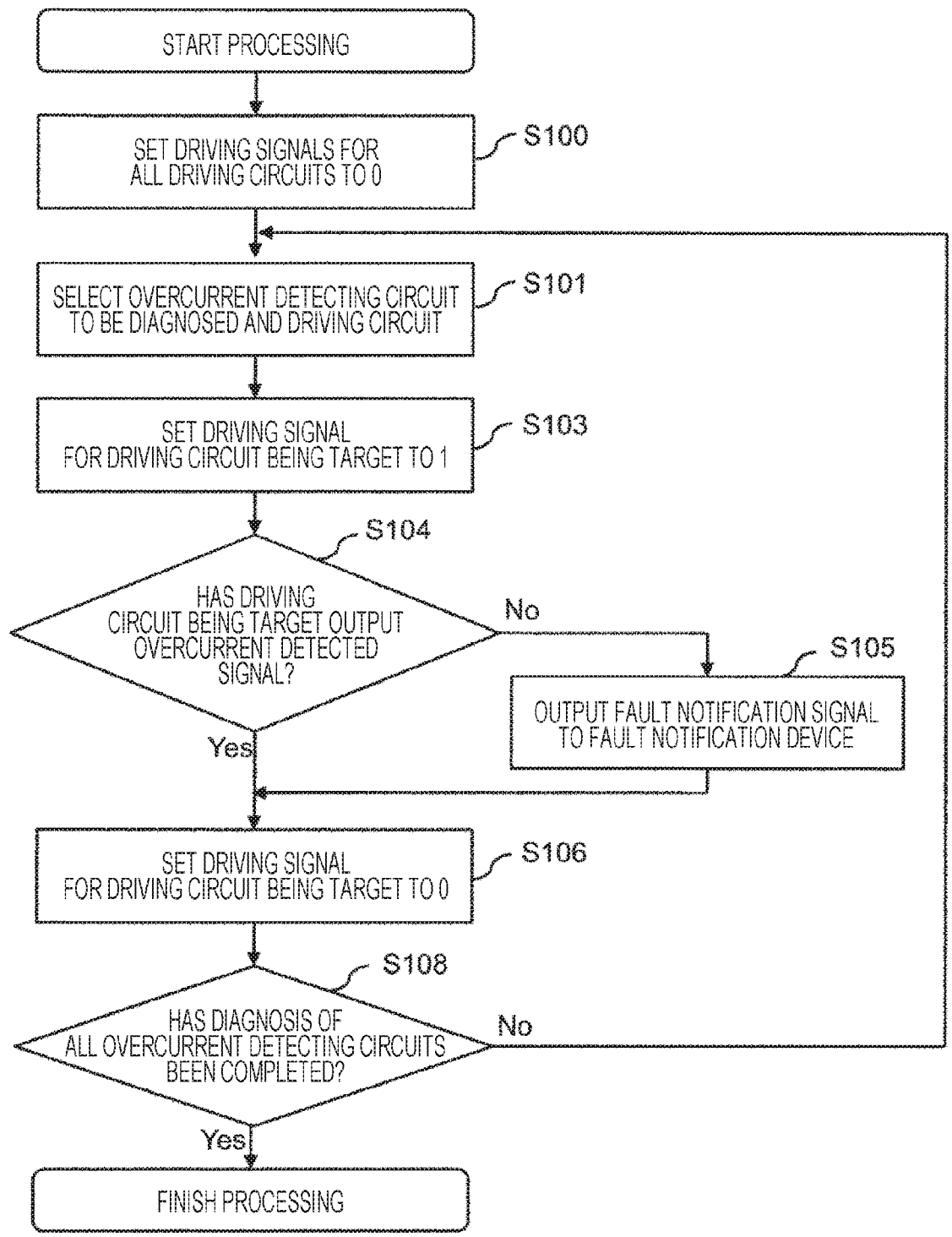
FIG. 13 is a flowchart of diagnosis processing of an overcurrent detecting circuit according to the fifth embodiment.

FIG. 13 is a flowchart of diagnosis processing of the overcurrent detecting circuit according to the present embodiment. The diagnosis flowchart according to the present embodiment, excludes step S102 and step S107 from the diagnosis flowchart according to the first embodiment, and thus the description of individual pieces of processing will be omitted.

According to the present embodiment, the diagnosis signal applying circuit 42 determines whether to apply the diagnosis signal to the overcurrent detecting circuit 12, on the basis of whether the respective gate signals of the driving circuits 6a to 6f satisfy the specific combination. With this arrangement, the control circuit 4 is not required to transmit a signal for diagnosis, to the diagnosis signal applying circuit 42, and thus addition of an insulating element for the signal transmission, is not required. Therefore, the diagnosis of the overcurrent detecting circuits 12 can be achieved at low cost.

Note that, according to the present embodiment, the gate signals are mutually connected between the driving circuits 41a to 41f, but, for example, the gate signals may be mutually connected only between the driving circuits (41a, 41b, and 41c) on the upper side. Alternatively, the gate signals may be mutually connected only between the driving circuits (41d, 41e, and 41f) on the lower side.

Sixth Embodiment

According to the present embodiment, an exemplary driving device capable of diagnosing that an abnormality detecting circuit can normally output an abnormality detected signal and additionally a gate signal can be normally interrupted, in the configuration according to the fifth embodiment, will be given. The configuration of the driving device and the peripheral circuit thereof is the same as that according to the fifth embodiment, and thus the description will be omitted. Similarly, the configuration of a power semiconductor and a driving circuit and the internal configuration of a drive power source circuit, are the same as those according to the fifth embodiment, and thus the descriptions will be omitted.

Figure 14:
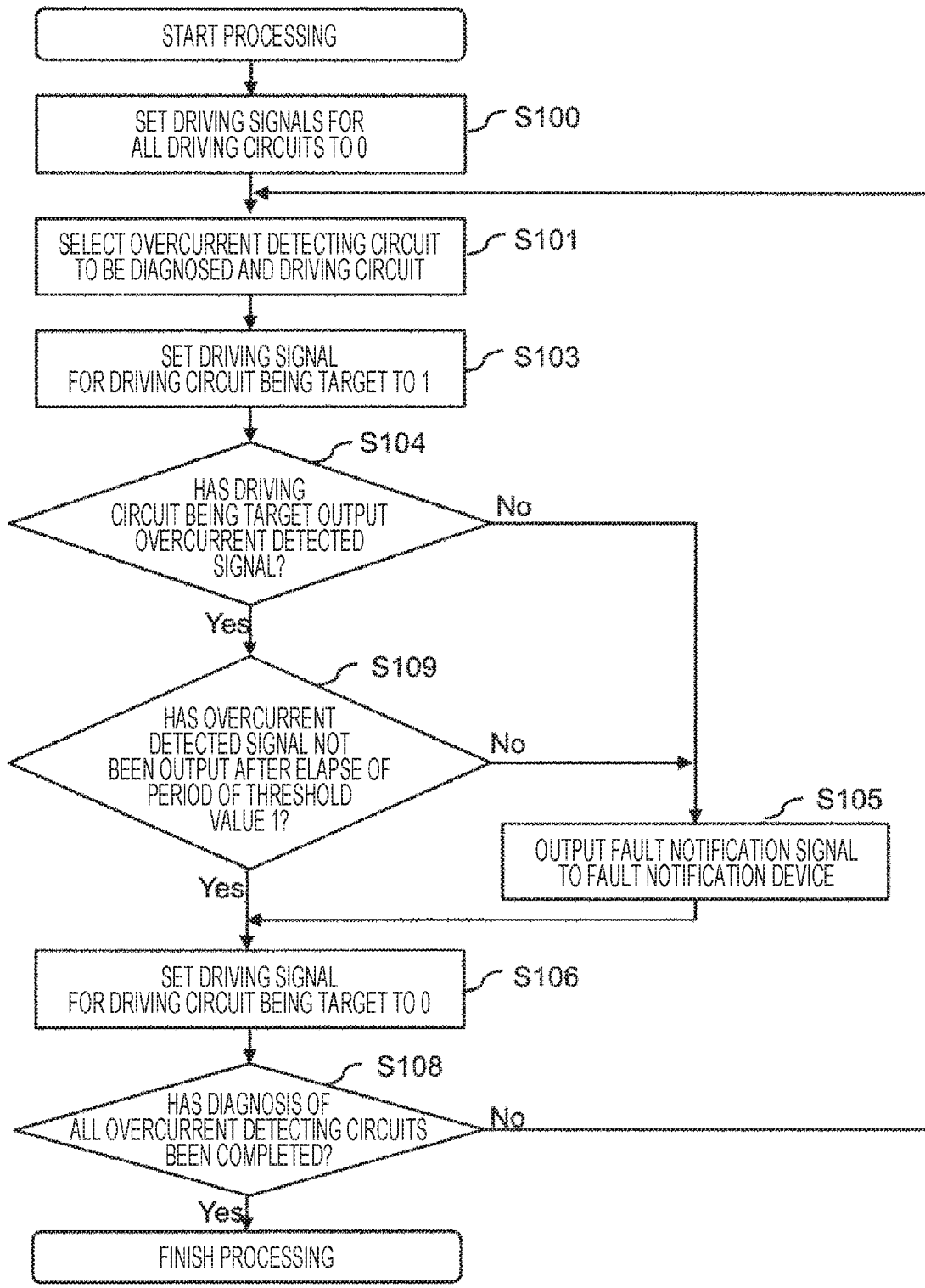
FIG. 14 is a flowchart of diagnosis processing of an overcurrent detecting circuit according to a sixth embodiment.

FIG. 14 is a flowchart of diagnosis processing of an overcurrent detecting circuit according to the present embodiment. The diagnosis flowchart according to the present embodiment, excludes step S102 and step S107 from the diagnosis flowchart according to the second embodiment, and thus the description of individual pieces of processing will be omitted.

Note that, according to the fifth embodiment, the exemplary combination of the gate signals in which all the power semiconductors 6a to 6f are tuned OFF, has been described for the specific combination of the gate signals when the diagnosis signal applying circuit 42 applies the diagnosis signal. However, in order to check the interrupting of the gate signal, the gate signal 19 of the power semiconductor 6 connected with the overcurrent detecting circuit 12 to be diagnosed, must be at least equivalent to a drive power source voltage 18, namely, must be at least ready to turn the power semiconductor 6 ON.

According to the present embodiment, it can be diagnosed that the gate signal 19 is normally interrupted, even in the configuration according to the fifth embodiment, as described in the second embodiment.

Note that, according to each of the first to sixth embodiments, the overcurrent detecting circuit 12 being the abnormality detecting circuit has been exemplarily described, but a similar diagnosis method can be applied to the overheating detecting circuit 13.

The present invention is not limited to the embodiments, and thus includes various modifications. For example, the embodiments have been described in detail in order to easily understand the present invention. The present invention is not necessarily limited to including all the configurations described above. A part of the configuration in one embodiment can be replaced with the configuration in another embodiment. In addition, the configuration in one embodiment can be added with the configuration in another embodiment. Regarding a part of the configuration in each embodiment, additions, deletions, and replacements of the other configurations may be made. For example, regarding each of the configurations, the functions, the processing units, and the processing means, part or all thereof may be achieved by hardware, for example, designed with an integrated circuit. For example, each of the configurations and the functions may be achieved by software in which a processor interprets and executes respective programs for achieving the functions. Information, such as the program, a table, or a file for achieving each function, can be stored in a recording device, such as a memory, a hard disk, or a solid state drive (SSD), or a recording medium, such as an IC card, an SD card, or a DVD.

REFERENCE SIGNS LIST 1 external power source (battery)
2 load (three-phase alternating current motor)
3 driving device
4 control circuit
5 current sensor
6 power semiconductor
7 driving circuit
8 fault notification device
10 drive power source circuit
11 drive circuit
12 overcurrent detecting circuit
13 overheating detecting circuit
14 diagnosis signal applying circuit
15 resistor
16 temperature sense element
17 source voltage
18 drive power source voltage
19 gate signal
20 overcurrent detecting terminal voltage
21 voltage switching signal
22 driving signal
23 overcurrent detected signal
24 overheating detected signal
30 driving device
31 driving circuit
32 drive power source circuit
33 diagnosis signal applying circuit
40 driving device
41 driving circuit
42 diagnosis signal applying circuit
50 wiring
51 gate signal
100 direct current power source
101 voltage control circuit
102 transformer
103 switching transistor
104 rectifier diode
105 smoothing capacitor
106 voltage-dividing resistor
107 variable-voltage resistor
108 variable-voltage transistor
109 rectifier diode
110 smoothing capacitor
111 PWM signal
112 feedback voltage
140 Zener diode
141 resistor
142 resistor
143 resistor
145 diode
146 resistor
147 diode
148 resistor
149 capacitor
150 logic gate

The invention claimed is:

1. A driving device comprising:
a drive circuit configured to output a gate signal to a power semiconductor;
an abnormality detecting circuit configured to detect an abnormality of the power semiconductor; and
a diagnosis signal applying circuit configured to apply a diagnosis signal to the abnormality detecting circuit, wherein
the diagnosis signal applying circuit receives the gate signal output by the drive circuit, and applies the diagnosis signal, based on the gate signal output by the drive circuit.

2. The driving device according to claim 1, wherein
the diagnosis signal applying circuit applies the diagnosis signal when a voltage value of the gate signal output by the drive circuit exceeds a predetermined threshold value.

3. The driving device according to claim 1, wherein
the diagnosis signal applying circuit applies the diagnosis signal when a voltage value of the gate signal output by the drive circuit does not vary during a predetermined period of time or more.

4. The driving device according to claim 1, wherein
a plurality of the drive circuits is provided corresponding to a plurality of the power semiconductors, and
the diagnosis signal applying circuit applies the diagnosis signal when a plurality of the gate signals output by the plurality of the drive circuits, is in predetermined combination.

5. The driving device according to claim 1, wherein
the abnormality detecting circuit has a function of outputting an abnormality detected signal to a control circuit when detecting the abnormality of the power semiconductor, and
the control circuit determines that the abnormality detecting circuit has been broken down, in a case where the abnormality detecting circuit does not output the abnormality detected signal when the diagnosis signal applying circuit applies the diagnosis signal to the abnormality detecting circuit.

6. The driving device according to claim 1, wherein
the abnormality detecting circuit has a function of outputting an abnormality detected signal to a control circuit and additionally outputting a gate interrupting signal to the drive circuit when detecting the abnormality of the power semiconductor, and
the drive circuit stops the output of the gate signal, based on the gate interrupting signal output by the abnormality detecting circuit.

7. The driving device according to claim 6, wherein
the control circuit determines that either the drive circuit or the abnormality detecting circuit has been broken down, in a case where the abnormality detecting circuit continues to output the abnormality detected signal for a predetermined period of time or more, with the control circuit retaining a driving signal in a driven state.

8. The driving device according to claim 1, wherein
the abnormality detecting circuit detects the abnormality of the power semiconductor when detecting a potential difference exceeding a predetermined voltage value, and
the diagnosis signal applying circuit outputs a diagnosis voltage, based on the gate signal output by the drive circuit.

9. The driving device according to claim 1, wherein the abnormality detecting circuit includes an overcurrent detecting circuit that detects that a current having a predetermined current value or more flows into the power semiconductor.

10. The driving device according to claim 1, wherein the abnormality detecting circuit includes an overheating detecting circuit that detects that a temperature of the power semiconductor is a predetermined temperature or more.

11. The driving device according to claim 1, wherein the drive circuit includes a drive power source, the drive power source outputting one of a first voltage and a second voltage that is higher than the first voltage, the diagnosis signal applying circuit applies the diagnosis signal, based on the gate signal output by the drive circuit, when a voltage value of the gate signal is equivalent to the second voltage of the drive power source.

* * * * *